United States Patent [19]

Fujii

[11] Patent Number: 5,371,756
[45] Date of Patent: Dec. 6, 1994

[54] SEMICONDUCTOR BLUE-GREEN LASER DIODES

[75] Inventor: Hiroaki Fujii, Tokyo, Japan

[73] Assignee: NEC Corporation, Tokyo, Japan

[21] Appl. No.: 187,506

[22] Filed: Jan. 28, 1994

[30] Foreign Application Priority Data

Jan. 29, 1993 [JP] Japan .................. 5-013419

[51] Int. Cl.$^5$ ............................ H01S 3/19
[52] U.S. Cl. ........................ 372/45; 257/13;
    257/22; 257/78; 257/103; 257/200; 372/46
[58] Field of Search ............... 372/45, 46, 43; 257/13,
    257/22, 78, 103, 200, 201

[56] References Cited

U.S. PATENT DOCUMENTS

| | | | |
|---|---|---|---|
| 4,992,837 | 2/1991 | Sakai et al. | 372/45 |
| 5,260,958 | 11/1993 | Fitzpatrick | 372/45 |
| 5,291,506 | 3/1994 | Ahn | 372/45 |
| 5,319,219 | 6/1994 | Cheng et al. | 257/14 |

FOREIGN PATENT DOCUMENTS 1-187885  7/1989  Japan .

OTHER PUBLICATIONS

Haase et al., "Blue-green laser diodes", Appl. Phys. Lett., vol. 59, No. 11, Sep. 9, 1991, pp. 1272–1274.
Jeon et al., "Blue-green diode lasers in ZnSe-based quantum wells", Appl. Phys. Lett., vol. 60, No. 17, Apr. 27, 1992, pp. 2045–2047.
Okuyama et al., "ZnSe/ZnMgSSe Blue Laser Diode", Electronics Letters, vol. 28, No. 19, Sep. 10, 1992, pp. 1798–1799.
Fan et al., "Graded band gap ohmic contact to p-ZnSe", Appl. Phys. Lett., vol. 61, No. 26, Dec. 28, 1992, pp. 3160–3162.

*Primary Examiner*—Georgia Y. Epps
*Attorney, Agent, or Firm*—Sughrue, Mion, Zinn, Macpeak & Seas

[57] ABSTRACT

A semiconductor blue-green light emitting device in a double heterostructure configuration includes a light emitting layer, a p-type clad layer and an n-type clad layer sandwiching the light emitting layer, a cap layer and a contact layer in this sequence formed on the clad layer. The light emitting layer contains at least one of CdZnSe, ZnSSe, and ZnSe, each of the p-type clad layer and the n-type clad layer contains at least one of ZnSSe, ZnSe and ZnMgSSe, the cap layer is of $(Al_xGa_{1-x})_{0.5}In_{0.5}P$ ($0 \leq X \leq 1$), and the contact layer is of $Al_xGa_{1-x}As$ ($0 \leq X \leq 1$). The diode provided is with improved ohmic characteristics.

4 Claims, 2 Drawing Sheets

SEMICONDUCTOR BLUE-GREEN LASER DIODES

BACKGROUND OF THE INVENTION (1) Field of the Invention

The present invention relates to a semiconductor light emitting device, and more particularly to a semiconductor light emitting device which emits blue-green or blue light and in which ohmic characteristics are improved.

(2) Description of the Related Art

In recent years, extensive research and development work is being made on a blue-green (or blue) light emitting device, especially on a semiconductor blue-green laser. This is due to the improvement in p-type doping. As noted in the report concerning the operation under pulsed current injection at 77 K by M. A. Haase et al. of 3M in Applied Physics Letters, 1991, Vol. 59, No. 11, pp 1272–1274, the p-type doping had long been one of the most significant obstacles. This is followed by reports on remarkable achievement, such as a report on similar blue-green laser characteristics by researchers in Brown University and Purdue University published in Applied Physics Letters, 1992, Vol. 60, No. 17, pp 2045–2047 and a report on tile continuous wave operation of a blue laser diode at 77 K by researchers in Sony Corporation published in Electronics Letters, 1992, Vol. 28. No. 19, pp 1798–1799.

However, a great problem in the blue-light-emitting device today is that, because the electronic affinity is large in II-VI materials, no satisfactory ohmic electrode has been found and heat generation has been an obstacle for the improvement of the required characteristics. As an example of a blue-green laser device, FIG. 1 shows a structure which was disclosed in the report by Haase et al referred to above. In this structure, a gold electrode is directly bonded to a II-VI material so that the value of the turn-on voltage of the diode is very large. Also, in Japanese Patent Application Kokal Publication No. Hei 1-87885, Kamata et al propose an arrangement wherein the II-VI material and the electrode sandwich between them a GaAs layer, or a single crystal and a compound of III-V materials such as a GaP, InP. FIG. 2 shows in sectional view a semiconductor light emitting diode proposed by Kamata et al. With this structure, too, in the case of the former, that is, the GaAs layer, there is a problem in that the current injection is hindered by spikes due to heretojunction between the GaAs and the II-VI material. In the case of the latter, although some improvement is seen over the case wherein the electrode is bonded directly on the II-VI material, there are problems in that high ohmic resistance still remains and that the surface treatment involves difficulties because the GaInP is easily eroded by, for example, hydrochloric acid.

SUMMARY OF THE INVENTION

It is an object of the invention to overcome the problems existing in the prior art and to provide an improved semiconductor blue-green light emitting device in which ohmic characteristics of the electrode are improved.

According to one aspect of the invention, there is provided a semiconductor blue-green light emitting device in a double heterostructure configuration, comprising:

a substrate;

a light emitting layer which contains at least one of CdZnSe, ZnSSe, and ZnSe;

a p-type clad layer and an n-type clad layer each of which contains at least one of ZnSSe, ZnSe and ZnMgSSe and which are provided at two sides of the light emitting layer, respectively;

a cap layer of $(Al_xGa_{1-x})_{0.5}In_{0.5}P$ ($0 \leq X \leq 1$) which is deposited on the clad layer located at an opposite side of the light emitting layer from the substrate; and a contact layer of $Al_xGa_{1-x}As$ ($0 \leq X \leq 1$) which is deposited on the cap layer.

Thus, the invention provides the semiconductor light emitting device in which the ohmic characteristics have been greatly improved over those in the conventional blue-green light emitting diode and in which excellent oscillation characteristics are obtained.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments according to the invention are explained with reference to the accompanying drawings.

Figure 2:
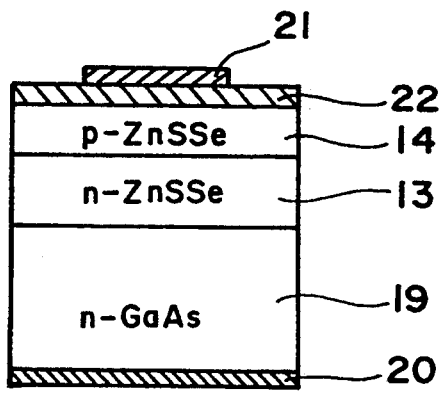
FIG. 2 is a cross-sectional view of another conventional semiconductor light emitting diode.
Figure 3:
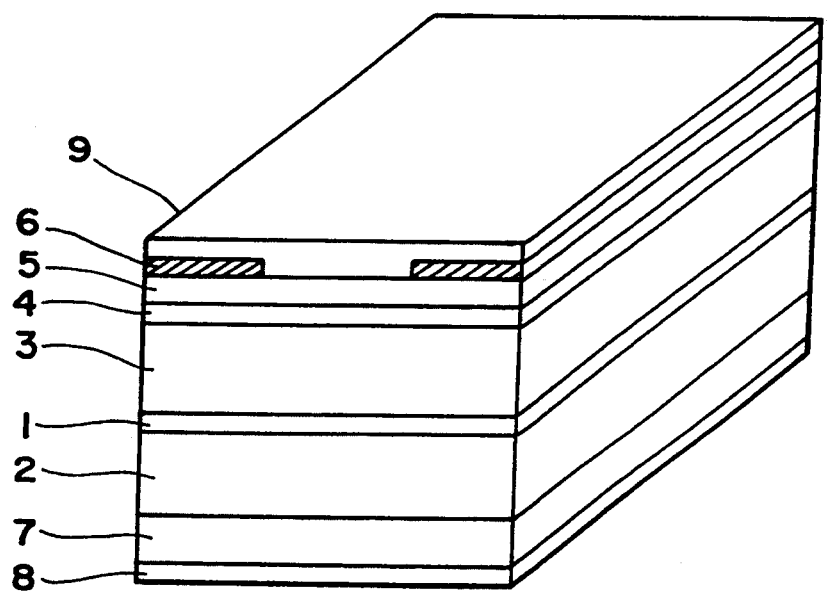
FIG. 3 is a perspective view of a gain guided laser of a first embodiment according to the invention.
Figure 4:
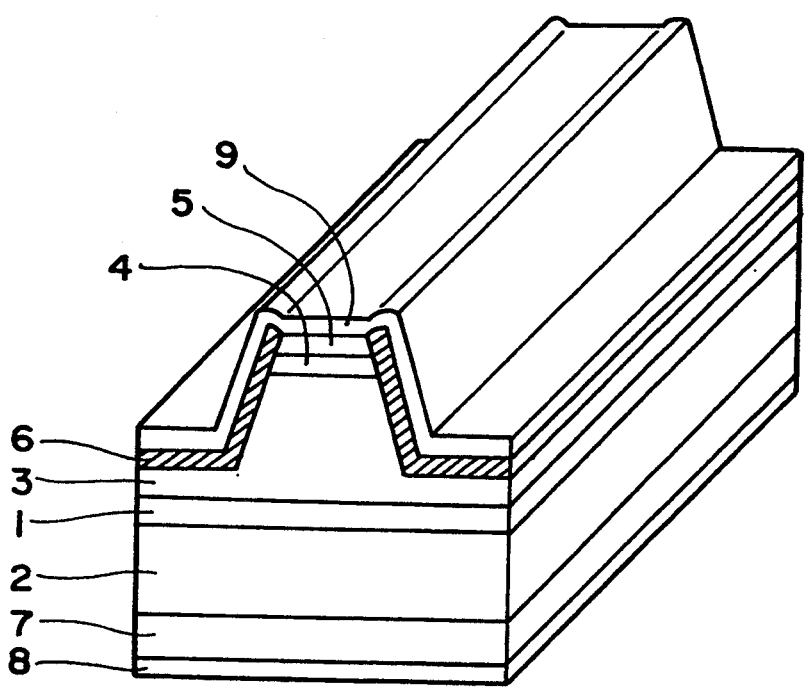
FIG. 4 is a perspective view of an index guided laser of a second embodiment according to the invention.

FIG. 3 shows a first embodiment of the invention which relates to a gain guided laser in which a dielectric insulating film 6 is provided with an opening in a stripe form, and FIG. 4 shows a second embodiment of the invention which relates to an index guided laser in which a clad layer 3 is formed in a mesa stripe and a current is blocked by the dielectric insulating layer 6. In the structure shown in FIG. 3, a light emitting layer containing at least one of CdZnSe, ZnSSe and ZnSe is sandwiched between a P-type clad layer 3 and an n-type clad layer 2 each of which contains at least one of ZnSSe, ZnSe, and ZnMgSSe whereby a double heterostructure is formed. The important feature of the invention resides in an arrangement wherein, in the double heterostructure, a $(Al_xGa_{1-x})_{0.5}In_{0.5}P$ ($0 \leq X \leq 1$) cap layer 4 and an $Al_xGa_{1-x}As$ ($0 \leq X \leq 1$) contact layer 5 in combination in this sequence are deposited on the clad layer 3, and an electrode 9 is attached on the resulting surface. In this way, a good ohmic contact is achieved between the uppermost $Al_xGa_{1-x}As$ contact layer 5 and the metal electrode 9, whereby the problem on the high ohmic resistance as in the conventional structure of FIG. 1 has been solved. Also, since there is inserted between the AlGaAs contact layer 5 and the II-VI clad layer 3 an AlGaInp cap layer 4 which has an intermediate energy band-gap, this prevents the deterioration of the ohmic characteristics caused by the spikes in the heterostructure noted in the conventional structure of FIG. 2. Also, since the uppermost layer is constituted by the GaAs layer which has been well tested in the practical lasers such as an AlGaAs laser and an AlGaInp laser, there is an assurance that the uppermost layer has sufficient resistance to various acids in the surface treatment.

Figure 1:
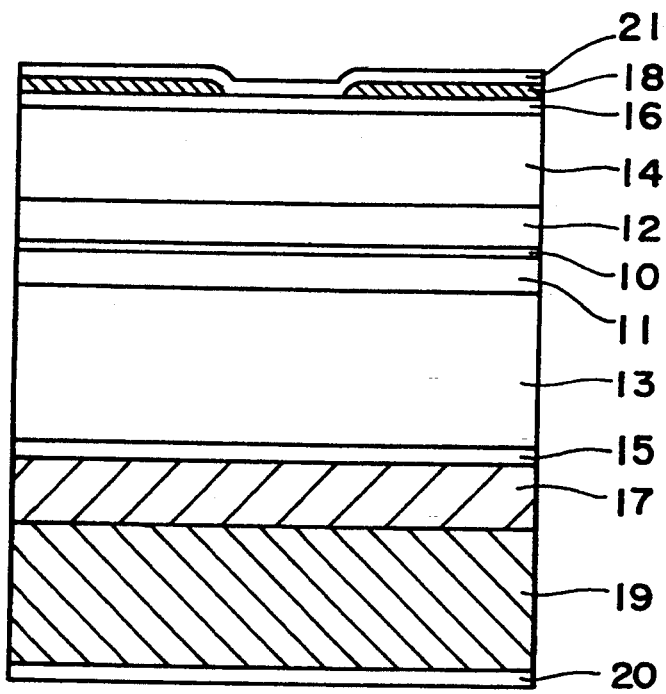
FIG. 1 is a cross-sectional view of a conventional semiconductor light emitting diode.

In FIGS. 1 and 2 showing the prior art to which these embodiments of the invention have relevance, the numeral 10 is for a CdZnSe quantum well active layer, 11 and 12 for ZnSe guide layers, 13 and 14 for ZnSSe clad layers, 15 and 16 for ZnSe layers, 17 for a GaAs buffer layer, 18 for a polyimide insulating layer, 19 for a GaAs substrate, 20 for an n-side electrode, 21 for a p-side electrode, and 22 for a p-side GaAs layer.

Now, further details of the embodiments according to the invention are explained. The gain guided laser shown in FIG. 3 is fabricated according to the following process steps. First, on a GaAs substrate 7, there are formed by molecular-beam epitaxy (MBE) a Cl doped n-type ZnSSe clad layer 2, an undoped ZnCdSe active layer 1 (corresponding to the light emitting layer), and an N doped p-type ZnSSe clad layer 3. In this way, double heterostructure is formed. The doping in the N doped ZnSSe is performed by using RF plasma. Next, a GaInP cap layer 4 and a GaAs contact layer 5 are grown respectively by metalorganic chemical vapor deposition (MOCVD) at the growth temperature of 400° C. using organic group V materials, for example, dimethyl amino phosphine (DMAP), tertiary-butyl phosphine (TBP) and di-methyl amino arsine (DMAAs) or tertiary-butyl arsine (TBAs). The organic group V materials are used because the growth can be made at a lower temperature compared with an ordinary MOVPE and any damage in crystal characteristics in the underlying II–VI material may be prevented when the growth takes place on the II–VI material. Then, on the GaAs contact layer 5, an $SiO_2$ film 6 is provided with a stripe form opening. Finally, the p-side electrode 9 and the n-side electrode 8 are attached to the resulting structure and a cavity is formed, whereby the laser structure is completed.

Whereas, in the conventional blue-green laser diode, the turn-on voltage was about 10V, in the structure shown in FIG. 3, the turn-on voltage is widely reduced to almost 3V which is determined by the energy gandgap, whereby excellent oscillation characteristics have been obtained.

The index guided laser shown in FIG. 4 has a configuration which is widely used in semiconductor lasers. However, when the blue-green laser is formed in such configuration, it has not been possible to achieve the oscillation in the structure having a small contact area because of high resistance between the uppermost semiconductor layer and the electrode layer. In the structure shown in FIG. 4, since GaInP cap layer 4 and GaAs contact layer 5 have been introduced in the index guided structure, the ohmic characteristics have been improved thereby enabling to obtain good oscillation characteristics.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor blue-green light emitting device in a double heterostructure configuration, comprising:
   a substrate;
   a light emitting layer which contains at least one of CdZnSe, ZnSSe, and ZnSe;
   a p-type clad layer and an n-type clad layer each of which contains at least one of ZnSSe, ZnSe and ZnMgSSe and which are provided at two sides of said light emitting layer, respectively;
   a cap layer of $(Al_xGa_{1-x})_{0.5}In_{0.5}P$ ($0 \leq X \leq 1$) which is deposited on said clad layer located at an opposite side of said light emitting layer from said substrate; and
   a contact layer of $Al_xGa_{1-x}As$ ($0 \leq X \leq 1$) which is deposited on said cap layer.

2. A semiconductor blue-green light emitting device according to claim 1, in which said cap layer and said contact layer are made of organic group V materials.

3. A semiconductor blue-green light emitting device according to claim 1, which further comprises a dielectric insulating layer which is formed on said contact layer and which has a stripe opening, and a metal electrode which is provided in said stripe opening.

4. A semiconductor blue-green light emitting device according to claim 1, in which said clad layer disposed at the opposite side of said light emitting layer from the substrate is configured in a mesa stripe with its two side surfaces and two laterally positioned surfaces being covered with dielectric insulating films, respectively.

* * * * *

UNITED STATES PATENT AND TRADEMARK OFFICE
CERTIFICATE OF CORRECTION

PATENT NO. : 5,371,756
DATED : December 6, 1994
INVENTOR(S) : Fujii

It is certified that error appears in the above-identified patent and that said Letters Patent is hereby corrected as shown below:

Column 1, line 26, delete "tile" and insert --the--;
Column 1, line 42, delete "Hel" and insert --Hei--.

Signed and Sealed this

Thirteenth Day of June, 1995

Attest:

BRUCE LEHMAN

Attesting Officer     Commissioner of Patents and Trademarks